(12) United States Patent
Miya et al.

(10) Patent No.: US 7,892,983 B2
(45) Date of Patent: Feb. 22, 2011

(54) SUBSTRATE PROCESSING APPARATUS AND PRODUCING METHOD OF SEMICONDUCTOR DEVICE

(75) Inventors: Hironobu Miya, Toyama (JP); Taketoshi Sato, Toyama (JP); Norikazu Mizuno, Toyama (JP); Masanori Sakai, Takaoka (JP); Takaaki Noda, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 507 days.

(21) Appl. No.: 11/664,726

(22) PCT Filed: Oct. 5, 2005

(86) PCT No.: PCT/JP2005/018469

§ 371 (c)(1),
(2), (4) Date: Nov. 29, 2007

(87) PCT Pub. No.: WO2006/038659

PCT Pub. Date: Apr. 13, 2006

(65) Prior Publication Data

US 2008/0166882 A1    Jul. 10, 2008

(30) Foreign Application Priority Data

Oct. 7, 2004 (JP) ............................. 2004-294908

(51) Int. Cl.
*H01L 21/31* (2006.01)
*H01L 21/469* (2006.01)

(52) U.S. Cl. ..................... 438/761; 73/28.01; 73/28.04; 73/29.01

(58) Field of Classification Search .................. None
See application file for complete search history.

(56) References Cited

U.S. PATENT DOCUMENTS 5,578,746 A * 11/1996 Campbell .................. 73/28.01

FOREIGN PATENT DOCUMENTS

| JP | 2001-338883 A | | 12/2001 |
|---|---|---|---|
| JP | 2002-246379 A | | 8/2002 |
| JP | 2003-45863 A | | 2/2003 |
| JP | 2003045863 A | * | 2/2003 |
| JP | 2004-23043 A | | 1/2004 |
| JP | 2004023043 A | * | 1/2004 |

* cited by examiner

*Primary Examiner*—David Vu
*Assistant Examiner*—Shantanu C Pathak
(74) *Attorney, Agent, or Firm*—Birch, Stewart, Kolasch & Birch, LLP

(57) ABSTRACT

Disclosed is a substrate processing apparatus, comprising a processing chamber, a holder to hold at least a plurality of product substrates, a heating member, a supplying member to alternately supply at least a first reactant and a second reactant, and a control unit, wherein the control unit executes forming thin films on the substrates by supplying the first reactant, removing a surplus of the first reactant after the first reactant has been adsorbed on the product substrates, subsequently supplying the second reactant, to cause the second reactant to react with the first reactant adsorbed on the substrates, and executes the forming the thin films in a state where a number of the product substrates is insufficient when a number of the product substrates is less than a maximum number of the product substrates which can be held by the holder.

3 Claims, 6 Drawing Sheets

SUBSTRATE PROCESSING APPARATUS AND PRODUCING METHOD OF SEMICONDUCTOR DEVICE

The present invention relates to a substrate processing apparatus and a producing method of a semiconductor device, and more particularly, to a substrate processing apparatus and a producing method of a semiconductor device in which a desired film is produced on a substrate such as a wafer by an ALD (Atomic Layer Decomposition) method.

BACKGROUND ART

In a substrate processing apparatus and a producing method of a semiconductor device in which a number of substrates are processed at once by using a thermal CVD (Chemical Vapor Deposition) method, the number of substrates loaded in a processing chamber to be processed at one time varies. For example, there are cases in which substrate processing for 50 substrates is carried out or substrate processing for 25 substrates is carried out even when 100 substrates can be processed. In such cases, the total number of substrates is made to be 100 by inserting substrates which are called fill-dummies in a region where product substrates are not disposed.

However, in such a method in which fill-dummy substrates are inserted, the more the number of the fill-dummy substrates, the more the production cost increases. Therefore, in the thermal CVD method, when a shortage of product wafers occurs, the product wafers are packed and placed in an upstream of gas flow without using the fill-dummies. Film thicknesses among the wafers are made to be unified by adjusting a preset temperature of a heater zone and changing a heat condition. When changing the preset temperature of the heater zone, only the region in which wafers exist is made to be a uniform temperature zone, and other regions are made to be a thermal insulating zone to suppress reactions in the thermal insulating zone, thereby preventing an effect to a wafer processing region (See Japanese Patent Application Publication Laid-open No. 2003-45863).

The product wafers are packed in the upstream of a gas flow because of the following reason: When there is a space in the upstream side, consumption of $SiH_2Cl_2$ which is gas for film forming processing for to film processing decreases. On the other hand, self decomposition of breaking down to $SiCl_2$ progresses and further, reaction of $SiH_2Cl_2$ is blocked because an adsorptive coefficient of $SiCl_2$ is one digit greater than the adsorptive coefficient of $SiH_2Cl_2$, and film forming speed does not become stable. Hence, to prevent such phenomenon, the product wafers are packed in the upstream of the gas flow.

Although the fill-dummies are not used in the above described art disclosed in Japanese Patent Application Publication Laid-open No. 2003-45863, heating condition needs to be changed because a thermal CVD method is used.

This change in heating condition due to the preset temperature change in each zone is carried out based on experiences by previous data, or carried out by correcting temperatures by automatically calculating the preset temperatures of each zone by using an interference line method.

It is a main object of the present invention to provide a substrate processing apparatus and a producing method of a semiconductor device in which a uniformity of film thicknesses among the substrates can be enhanced without setting a new condition even when the number of product substrates to be held by a holding member is less than the maximum number of the product substrates the holding member is capable of holding.

According to one aspect of the present invention, there is provided a substrate processing apparatus, comprising:
a processing chamber;
a holding member to hold at least a plurality of product substrates in the processing chamber,
a heating member to heat the substrates,
a supplying member to alternately supply at least a first reactant and a second reactant into the processing chamber;
an exhausting port opened to the processing chamber, and
a control unit,
wherein the control unit
executes a processing of forming thin films on the substrates by supplying the first reactant into the processing chamber, removing a surplus of the first reactant after the first reactant has been adsorbed on the product substrates which are held by the holding member, subsequently supplying the second reactant into the processing chamber, to cause the second reactant to react with the first reactant which has been adsorbed on the substrates, and
executes the processing of forming the thin films in a state where a number of the product substrates is insufficient when a number of the product substrates to be held by the holding member is less than a maximum number of the product substrates which can be held by the holding member.

According to another aspect of the present invention, there is provided a producing method of a semiconductor device, comprising:
a first step of allowing a holding member in a processing chamber to hold a plurality of product substrates,
a second step of heating the substrates,
a third step of supplying a first reactant into the processing chamber and allowing the first reactant to be adsorbed on the product substrates,
a fourth step of removing a surplus of the first reactant from inside the processing chamber,
a fifth step of supplying a second reactant into the processing chamber and allowing the second reactant to react with the first reactant which has been adsorbed on the product substrates to form thin films on the substrates, and
a sixth step of repeating at least the steps 3 to 5 for a predetermined times till the thin films having a desired thickness are formed on the product substrates, wherein
the steps 1 to 6 are carried out in a state where a number of the product substrates is insufficient when a number of the product substrates to be held by the holding member is less than a maximum number of the product substrates which can be held by the holding member.

According to still another aspect of the present invention, there is provided a substrate processing apparatus which comprises:
a processing chamber;
a holding member to hold a plurality of product substrates in the processing chamber;
a heating member to heat the substrates;
a supplying member to alternately supply at least a first reactant and a second reactant into the processing chamber; and
an exhausting port opened to the processing chamber, wherein
thin films are formed the substrates by supplying the first reactant, removing a surplus of the first reactant after the first reactant is adsorbed on the substrates, and subsequently supplying the second reactant to cause the second reactant to react with the first reactant which has been adsorbed on the substrates, and the apparatus comprises a control unit to execute the processing of forming the thin films in a state where a number of the product substrates is insufficient when a number of the product substrates to be held by the holding member is less than a maximum number of the product substrates which can be held by the holding member.

According to still another aspect of the present invention, there is provided a producing method of a semiconductor device wherein processing of forming thin films is carried out in a state where a number of the product substrates is insufficient when a number of the product substrates to be held by a holding member is less than a maximum number of the product substrates which can be held by the holding member by using a substrate processing apparatus which comprises:

a processing chamber;

a holding member to hold a plurality of product substrates in the processing chamber;

a heating member to heat the substrates;

a supplying member to alternately supply at least a first reactant and a second reactant in the processing chamber; and an exhausting port opened to the processing chamber, wherein the thin films are formed on the substrates by supplying the first reactant, removing a surplus of the first reactant after the first reactant is adsorbed on the substrates, subsequently supplying the second reactant to cause the second reactant to react with the first reactant which has been adsorbed on the substrate, and the apparatus comprises a control unit to execute the processing of forming the thin films in the state where the number of the product substrates is insufficient when the number of the product substrates to be held by the holding member is less than the maximum number of the product substrates which can be held by the holding member.

Figure 1:
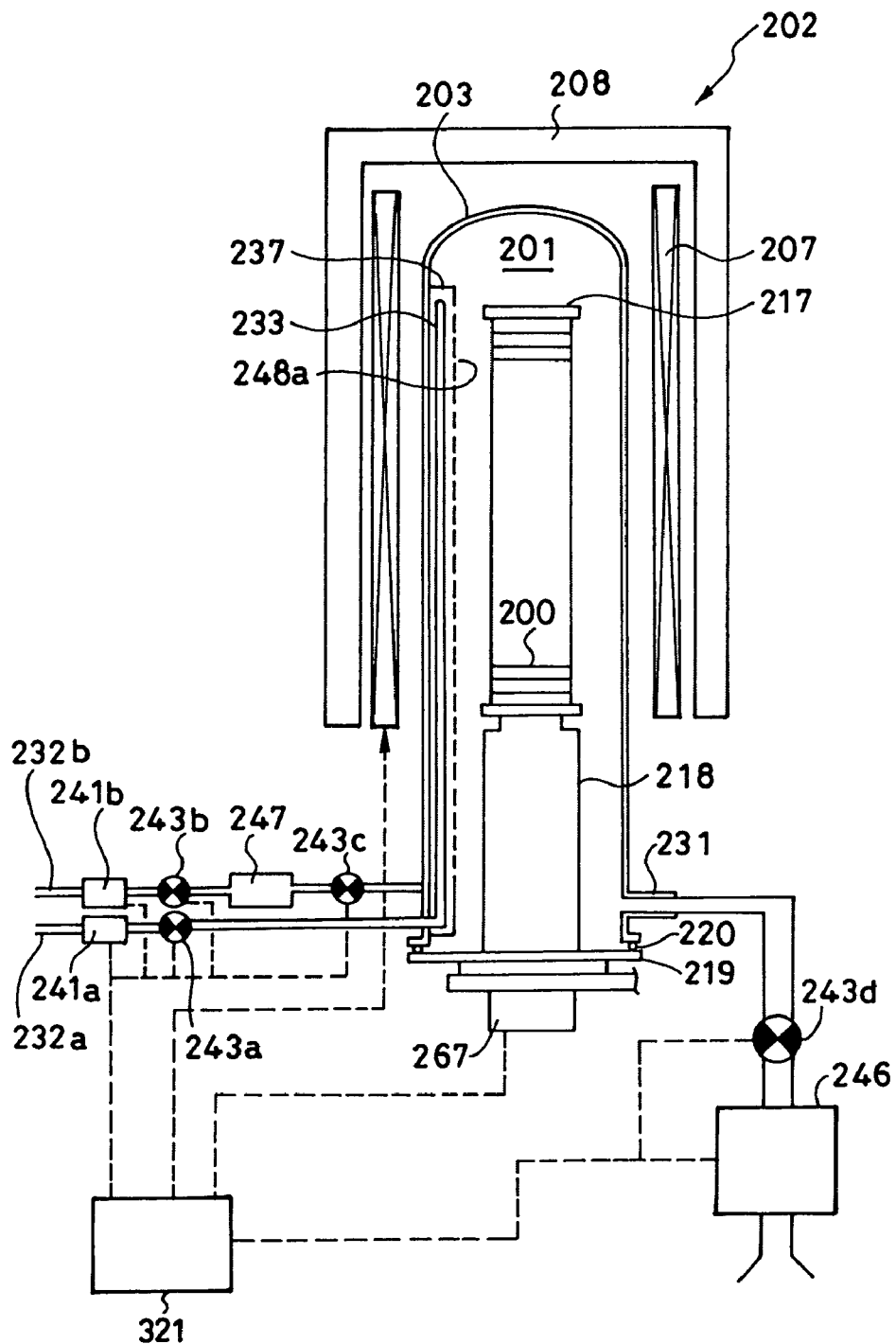
FIG. 1 is a schematic longitudinal sectional view for explaining a vertical substrate processing furnace of a substrate processing apparatus according to preferable embodiments of the present invention.

In preferred embodiments of the present invention, an ALD method is used to form a film instead of a CVD method. The ALD method is a technique for forming a film in such a manner that two (or more) kinds of raw material gases used for forming the film are alternately supplied onto a substrate one kind by one kind under a certain condition (temperature, time or the like) to cause each kind of the gases to be adsorbed on the substrate by one atom layer at a time, thereby forming the film utilizing a surface reaction.

That is, concerning chemical reaction to be utilized, when an SiN (silicon nitride) film is to be formed, in the ALD method, DCS ($SiH_2Cl_2$, dichlorosilane) and $NH_3$ (ammonia) are used, and a high quality film can be formed at a lower temperature of 300 to 600° C. Concerning gas supplying operation, a plurality kinds of reaction gases are supplied alternately one kind by one kind. A thickness of the film is controlled by the number of cycles of reaction gas supplying operations (if a film forming speed is 1 Å/one cycle, and if a film of 20 Å thickness is to be formed, the processing is carried out by 20 cycles).

In the preferred embodiments of the present invention, thin films are formed on the substrates by supplying a first reactant to a processing chamber, removing a surplus of the first reactant after the first reactant is adsorbed on product substrates which are held by a holding member, subsequently supplying a second reactant into the processing chamber to cause the second reactant to react with the first reactant which has been adsorbed on the substrates. When the number of product substrates to be held by a holding member is less than the maximum number of product substrates which can be held by the holding member, a control unit executes a processing of forming the thin film in a state where the number of product substrates is insufficient.

When the number of product substrates to be held by the holding member is less than the maximum number of the product substrates which can be held by the holding member, the control unit allows the product substrates to be packed and held on am upstream side of a gas flow of the holding member, and an exhausting side of the holding member to be a non-holding region, and executes the processing of forming the thin films on the substrates.

A supplying member is composed of an elongated nozzle which includes a large number of gas jet holes, the holding member is to hold a plurality of substrates so as to be stacked in layers in a longitudinal direction of the nozzle, and the exhausting port is positioned on one end side of the nozzle in the longitudinal direction. When the number of product substrates to be held by the holding member is less than the maximum number of product substrates which can be held by the holding member, the control unit allows the product substrates to be packed and held on another end side of the nozzle of the holding member in the longitudinal direction, and executes the processing of forming the thin films on the substrates.

When the number of product substrates to be held by the holding member is less than the maximum number of product substrates which can be held by the holding member, the control unit executes the processing of forming the thin films under a condition of the heating member that is the same as the condition when the maximum number of product substrates which can be held by the holding member is held by the holding member.

Concerning the product substrates, there are cases where the product substrates are only consisted of production substrates for actually producing semiconductor devices and the product substrates are consisted of the production substrates and side-dummies which are provided above and below the production substrates, and at least one side-dummy is preferably provided above the production substrates and at least one side-dummy is provided below the production substrates.

In the preferred embodiment of the present invention, the films are formed by the ALD method, which is different from the conventional CVD method in that the thin films are formed on the substrates one atom layer by one atom layer by allowing the second reactant to react with the first reactant which has been adsorbed on the substrates in the ALD method, whereas a vapor-phase reaction is carried out in the conventional CVD method. Therefore, when forming films by the ALD method, differently from the case of the conventional thermal CVD method, there is no need to change the preset temperature of each heater zone so as to make distribution of film thicknesses among the substrates be uniform even when the number of product substrates to be held by the holding member is less than the maximum number of product substrates which can be held by the holding member.

As a result, even when the number of product substrates to be held by the holding member is less than the maximum number of product substrates which can be held by the holding member, the processing of forming the thin films can be executed under the condition of the heating member that is the same as the condition when the maximum number of product substrates which can be held by the holding member is held by the holding member.

However, the film thickness of the film which is formed by the ALD method is influenced by the flow of the reactant gas, and also influenced by density of the gas to which the surfaces of the substrates are exposed. Therefore, even when the number of product substrates to be held by the holding member is less than the maximum number of product substrates which can be held by the holding member, the density of the gas to which the surfaces of the substrates are exposed is preferably the same as in the case in which the maximum number of product substrates which can be held by the holding member is held by the holding member.

Therefore, when the number of the product substrates to be held by the holding member is less than the maximum number of product substrates which can be held by the holding member, the product substrates are preferably packed and held in an upstream of a gas flow of the holding member, to form the thin films on the substrates, with the discharging port side of the holding member being the non-holding region.

When the supplying member is composed of an elongated nozzle which includes a large number of gas jet holes, the holding member holds a plurality of substrates so as to be stacked in layers in a longitudinal direction of the nozzle, the exhausting port is positioned at one end side of the nozzle in the longitudinal direction, and the number of product substrates which are to be held by the holding member is less than the maximum number of product substrates which can be held by the holding member, the product substrates are preferably packed and held on the other end side of the nozzle in the longitudinal direction. to form the thin films on the substrates.

When the number of product substrates to be held by the holding member is less than the maximum number of product substrates which can be held by the holding member, a method of placing the substrates evenly throughout the entire holding member by elongating intervals between the substrates is conceivable instead of packing the substrates in either end of the upstream of the gas flow or the longitudinal direction of the nozzle. According to such method, the intervals between the substrates change from the intervals in the case where the number of the product substrates to be held by the holding member is the maximum number of the substrates which can be held by the holding member, to change the amount of reaction gas which flows in between the substrates. As a result, the film thickness changes and this method is not preferred.

Next, preferable embodiments of the present invention will be described in detail with reference to the drawings.

Figure 2:
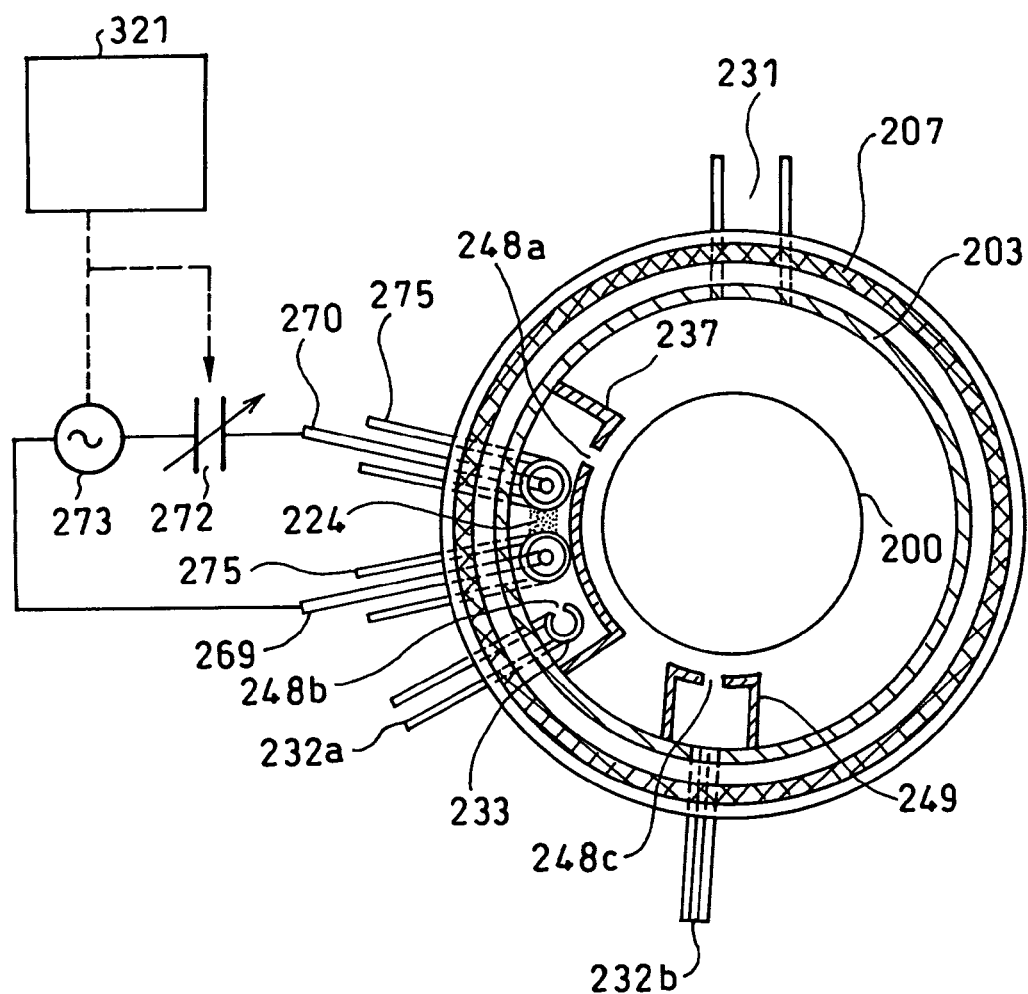
FIG. 2 is a schematic transversal sectional view for explaining the vertical substrate processing furnace of the substrate processing apparatus according to the preferable embodiments of the present invention.

FIG. 1 is a schematic structural view for explaining a vertical type substrate processing furnace according to the present embodiments showing a processing furnace portion in a longitudinal cross section, and FIG. 2 is a schematic structural view for explaining the vertical type substrate processing furnace according to the present embodiments showing the processing furnace portion in a traverse cross section.

A quartz-made reaction tube 203 is provided as a reaction chamber for processing wafers 200, which are a substrate, inside a heater 207 which is a heating means. A lower end opening of the reaction tube 203 is air-tightly closed with a seal cap 219, which is a lid, through an O-ring 220 which is a hermetic member. A thermal insulating member 208 is provided outside the reaction tube 203 and the heater 207. The thermal insulating member 208 is provided so as to cover an upper end of the heater 207. At least, the heater 207, the thermal insulating member 208, the reaction tube 203 and the seal cap 219 form a processing furnace 202. The reaction tube 203, the seal cap 219 and a later-described buffer chamber 237 formed in the reaction tube 203 form a processing chamber 201. A boat 217, which is a substrate-holding means, is provided above the seal cap 219 in a standing attitude through a quartz cap 218. The quartz cap 218 is a holding body which holds the boat 217. The boat 217 is inserted into the processing furnace 202. Plurality of wafers 200 to be batch-processed are loaded vertically in the boat 217 in an axial direction of the tube in a multi-stacked manner in their horizontal postures. The heater 207 heats the wafers 200 inserted into the processing furnace 202 to a predetermined temperature.

Two gas supply pipes 232a and 232b are provided as supply pipes for supplying plurality kinds (here, two kinds) of gases to the processing furnace 202. Reaction gas is supplied from the gas supply pipe 232a to the processing chamber 201 through a mass flow controller 241a which is a flow rate control means, a valve 243a which is an open/close valve and an after-described buffer chamber 237 formed in the reaction tube 203. Further, reaction gas is supplied from the gas supply pipe 232b to the processing chamber 201 through a mass flow controller 241b which is a flow rate control means, a valve 243b which is an open/close valve, a gas tank 247, a valve 243c which is an open/close valve, and an after-described gas supply unit 249.

To the gas supply pipe 232b, is fitted a pipe heater (not shown) which can heat the pipe 232b up to about 120° C. to prevent the liquefaction of raw material.

The processing chamber 201 is connected to a vacuum pump 246 which is an exhausting means through a valve 243d by a gas exhaust pipe 231 which is an exhaust pipe for exhausting gas, thereby evacuating the processing chamber 201. The valve 243d is an open/close valve which allows and stops the evacuation of the processing chamber 201 by opening and closing the valve 243d, and which can adjust pressure of the processing chamber 201 by adjusting its opening degree.

A buffer chamber 237 which is a gas dispersion space is provided in an arc-shaped space between the wafers 200 and an inner wall of the reaction tube 203 constituting the processing chamber 201. The buffer chamber 237 is provided with the inner wall of the reaction tube 203 along the stacking direction of the wafers 200 from a lower portion to an upper portion. Gas supply holes 248a which are supply holes for supplying gas are formed in an inner wall, at a location near an end thereof, of the buffer chamber 237 which is adjacent to the wafers 200. The gas supply holes 248a are opened toward the center of the reaction tube 203. The gas supply holes 248a have the same opening areas from a lower portion to an upper portion in the stacking direction of the wafers 200 over a predetermined length, and the gas supply holes 248a are formed with the same pitch.

A nozzle 233 is disposed near another end of the buffer chamber 237 opposite to the end at which the gas supply holes 248a are provided. The nozzle 233 is disposed along the stacking direction of the wafers 200 from the lower portion to the upper portion of the reaction tube 203. The nozzle 233 is provided with a plurality of gas supply holes 248b which are supply holes for supplying gas. The plurality of gas supply holes 248b are disposed over the same predetermined length as in the case of the gas supply holes 248a along the stacking direction of the wafers 200. The plurality of gas supply holes 248b and the plurality of gas supply holes 248a are disposed so as to respectively correspond to each other one hole by one hole.

When a pressure difference between the buffer chamber 237 and the processing furnace 202 is small, the opening areas of the gas supply holes 248b are preferably the same and the opening pitches may be the same from its upstream side toward its downstream side, but if the pressure difference is great, the opening areas are preferably increased or the opening pitches may be reduced from the upstream side toward the downstream side.

If the opening areas or the opening pitches of the gas supply holes 248b are adjusted from the upstream side to the downstream side, gases can be injected substantially at the same flow rate although flowing speeds of gases are different from one another among each gas supply holes 248b. Gas injected from each gas supply hole 248b is injected to the buffer chamber 237 and is once introduced, and the flowing speeds of gases are equalized.

That is, in the buffer chamber 237, gas particle velocity of gas injected from each gas supply hole 248b is moderated and then, the gas is injected into the processing chamber 201 from the gas supply holes 248a. During this time, gases injected from each gas supply holes 248b have equal flow rates and flowing speeds when the gases were injected from the each gas supply hole 248a.

A rod-like electrode 269 and a rod-like electrode 270 having a thin and long structure are disposed in the buffer chamber 237 such as to extend from an upper portion to a lower portion in the buffer chamber 237. The rod-like electrode 269 and the rod-like electrode 270 are protected by electrode protection tubes 275 which are protection tubes for protecting the electrodes. One of the first rod-like electrode 269 and the second rod-like electrode 270 is connected to a high frequency power supply 273 through a matching device 272, and the other is connected to a ground which is a reference potential. As a result, plasma is produced in a plasma producing region 224 between the rod-like electrode 269 and the rod-like electrode 270.

The electrode protection tubes 275 can be inserted into the buffer chamber 237 in a state where the rod-like electrode 269 and the rod-like electrode 270 are isolated from atmosphere in the buffer chamber 237. If the atmosphere in the electrode protection tube 275 is the same as outside air (atmosphere), the rod-like electrode 269 and the rod-like electrode 270 respectively inserted into the electrode protection tubes 275 are oxidized by heat from the heater 207. Thus, there is provided an inert gas purge mechanism which charges or purges inert gas such as nitrogen into and from the electrode protection tube 275, to reduce the oxygen concentration to a sufficiently low value, resulting in preventing the rod-like electrode 269 or the rod-like electrode 270 from being oxidized.

A gas supply unit 249 is provided on the inner wall of the reaction tube 203 at a location away from the gas supply holes 248a by about 120°. When a plurality of kinds of gases are supplied to the wafers 200 alternately one kind by one kind by the ALD method to form a film, the gas supply unit 249 is a supply unit which shares gas supply species with the buffer chamber 237.

Like the buffer chamber 237, the gas supply unit 249 also includes third gas supply holes 248c which are supply holes for supplying gas at the same pitch to a position adjacent to the wafer. The second gas supply tube 232b is connected to the gas supply unit 249 at a lower part thereof.

When the pressure difference between the buffer chamber 237 and the processing chamber 201 is small, it is preferable that the opening areas of the third gas supply holes 248c are equal to each other from the upstream side to the downstream side and the holes 248c are arranged at the same opening pitch, but when the pressure difference is great, it is preferable that the opening areas are increased or the opening pitch is reduced from the upstream side to the downstream side.

The boat 217 is provided at the central portion in the reaction tube 203. The plurality of wafers 200 are placed on the boat 217 in the vertical direction at the multi-stacked manner at an equal distance from one another. The boat 217 is brought into and out from the reaction tube 203 by a boat elevator mechanism (not shown). To enhance the uniformity of processing, a boat rotating mechanism 267 which is a rotating means for rotating the boat 217 is provided. If the boat rotating mechanism 267 is rotated, the boat 217 held by the quartz cap 218 is rotated.

A controller 321 is a control means. The controller 321 is connected to the mass flow controllers 241a and 241b, the valves 243a, 243b, 243c and 243d, the heater 207, the vacuum pump 246, the boat rotating mechanism 267, a boat elevator 212, the high frequency power supply 273 and the matching device 272. The controller 321 adjusts the flow rates of the mass flow controllers 241a and 241b, opens and closes the valves 243a, 243b, 243c and 243d, adjust the temperature of the heater 207, starts and stops the vacuum pump 246, adjusts the rotation speed of the boat rotating mechanism 267, controls the vertical motion of the boat elevator 121, controls the electricity supply to the high frequency power supply 273, and controls impedance by the matching device 272.

Next, an example of forming a SiN film using DCS and $NH_3$-gas by the ALD method will be explained.

First, wafers 200 on which films are to be formed are loaded on the boat 217 and the boat 217 is brought into the processing furnace 202. Then, the following three steps are sequentially carried out.

[Step 1]

In step 1, $NH_3$ gas which requires plasma excitation and DCS gas which does not require plasma excitation are allowed to flow together. First, the valve 243a provided in the gas supply pipe 232a and the valve 243d provided in the gas exhaust pipe 231 are opened together, thereby injecting the NH₃ gas, which is supplied from the gas supply pipe 232a and a flow rate of which is adjusted by the mass flow controller 241a, from the gas supply holes 249b of the nozzle 233 to the buffer chamber 237. High frequency electricity is applied between the rod-like electrodes 269 and 270 from the high frequency power supply 273 through the matching device 272 to plasma-excite NH₃, and the NH₃ is supplied to the processing chamber 201 as an active species, while the processing chamber 201 is exhausted through the gas exhaust pipe 231. When NH₃ gas is plasma-excited and allowed to flow as the active species, the valve 243d is appropriately adjusted such that the pressure in the processing chamber 201 becomes 10 to 100 Pa. The supply flow rate of NH₃ controlled by the mass flow controller 241a is 1,000 to 10,000 sccm. Time during which the wafers 200 are exposed to the active species obtained by plasma-exciting NH₃ is 2 to 120 seconds. The temperature of the heater 207 at that time is set to 300 to 600° C. Because NH₃ has a high reacting temperature, NH₃ does not react at the above described temperature of the wafers, which causes NH₃ to be flowed as the active species by plasma-exciting NH₃. Therefore, this processing can be carried out with the temperature of wafers being kept at the set low temperature range.

When NH₃ is supplied as the active species by plasma-exciting NH₃, the valve 243b located upstream of the gas supply pipe 232b is opened and the valve 243c located downstream of the gas supply pipe 232b is closed so that DCS is also allowed to flow. With this, DCS is accumulated in the gas tank 247 provided between the valves 243b and 243c. At that time, gas flowing into the processing chamber 201 is the active species obtained by plasma-exciting NH₃, and no DCS exists. Therefore, NH₃ does not cause vapor-phase reaction, and NH₃ which has been plasma-excited to be the active species surface-reacts with a foundation film on the wafer 200.

[Step 2]

In step 2, the valve 243a of the gas supply pipe 232a is closed to stop supply of NH₃. However, the supply of gas to the gas tank 247 is continued. When a predetermined amount of DCS of predetermined pressure is accumulated in the gas tank 247, the upstream valve 243b is also closed to trap DCS in the gas tank 247. The valve 243d of the gas exhaust pipe 231 is left open, the processing chamber 201 is exhausted by the vacuum pump 246 so that the pressure inside the processing chamber 201 is below or equal to 20 Pa, and residual NH₃ is exhausted from the processing chamber 201. At this time, if the inert gas such as N₂ is supplied into the processing chamber 201, an effect of exhausting the residual NH₃ is further enhanced. In the gas tank 247, DCS is accumulated so that the pressure becomes higher or equal to 20,000 Pa. The apparatus is constructed so that a conductance between the gas tank 247 and the processing chamber 201 becomes greater or equal to $1.5 \times 10^{-3}$ m³/s. When considering a ratio between a capacity of the reaction tube 203 and a capacity of the gas tank 247 required for the capacity of the reaction tube 203, the capacity of the gas tank 247 is preferably between 100 and 300 cc in the case where the capacity of the reaction tube 203 is 100 l (100 litters). As for a capacity ratio, the gas tank 247 is preferably between 1/1,000 and 3/1,000 times smaller than the capacity of the reaction chamber.

[Step 3]

In step 3, if the exhausting operation in the processing chamber 201 is completed, the valve 243d of the gas exhaust pipe 231 is closed to stop the exhausting operation. The valve 243c located downstream of the gas supply pipe 232b is opened. With this, DCS accumulated in the gas tank 247 is supplied to the processing chamber 201 at a dash. At that time, since the valve 243d of the gas exhaust pipe 231 is closed, the pressure in the processing chamber 201 is abruptly increased to about 931 Pa (7 Torr). Time during which DCS is supplied is set to 2 to 4 seconds, time during which the wafers are exposed to the increased pressure atmosphere is set to 2 to 4 seconds, and the total time is set to 6 seconds. The temperature of the wafer is the same as that when NH₃ is supplied and is 300 to 600° C. By supplying DCS, NH₃ on a foundation film surface-react with DCS and an SiN film is formed on the wafer 200. After the film is formed, the valve 243c is closed, the valve 243d is opened so that the processing chamber 201 is exhausted to vacuum, residual gas which is DCS after contributing to film forming is exhausted. If an inert gas such as N₂ is supplied to the processing chamber 201, an effect of exhausting the residual gas which is DCS after contributing to film forming is further enhanced. The valve 243b is opened and the supply of DCS to the gas tank 247 starts.

The above described steps 1 to 3 are set to be one cycle, and the SiN film having a predetermined film thickness is formed on the wafer by repeating this cycle for a plurality of times.

In the ALD apparatus, the gas adsorbs on the surface of the base film. This amount of adsorption of the gas is proportional to the pressure of the gas and the exposure time to the gas. Thus, in order to allow a desired certain amount of gas to be adsorbed in short time, there is a need to increase the pressure of the gas in short time. To this extent, in the embodiment, pressure of DCS inside the processing chamber 201 can be increased rapidly because DCS accumulated in the gas tank 247 is supplied instantaneously after the valve 243d is closed and desired certain amount of the gas can be adsorbed instantaneously.

In the embodiment, supplying of NH₃ gas as active species by plasma exciting NH₃ which is a needed step for the ALD method and exhausting of the processing chamber 201 are carried out while DCS is being accumulated in the gas tank 247. Therefore, a special step of accumulating DCS is not needed. Because DCS is allowed to flow after inside of the processing chamber 201 is exhausted and NH₃ gas is removed, DCS and NH₃ gas do not react with each other while flowing towards the wafers 200. The supplied DCS is allowed to react effectively only with NH₃ which is adsorbed to the wafer 200.

A case in which DCS is accumulated in the gas tank 247 is described above. When the gas tank 247 is not used, the following three steps are orderly executed. When the gas tank 247 is not used, the valve 243c at a downstream of the gas supplying tube 232b is neither used.

[Step 1]

In step 1, first, the valve 243a provided in the gas supply pipe 232a and the valve 243d provided in the gas exhaust pipe 231 are opened together, thereby injecting the NH₃ gas, which is supplied from the gas supply pipe 232a and a flow rate of which is adjusted by the mass flow controller 241a, from the gas supply holes 248b of the nozzle 233 to the buffer chamber 237. High frequency electricity is applied between the rod-like electrodes 269 and 270 from the high frequency power supply 273 through the matching device 272 to plasma-excite NH₃, and the NH₃ is supplied to the processing chamber 201 as the active species, while the processing chamber 201 is exhausted through the gas exhaust pipe 231. When NH₃ gas is plasma-excited and allowed to flow as the active species, the processing chamber 201 becomes 10 to 100 Pa. The supply flow rate of NH₃ controlled by the mass flow controller 241a is 1,000 to 10,000 sccm. Time during which the wafers 200 are exposed to the active species obtained by plasma-exciting NH₃ is 2 to 120 seconds. The temperature of the heater 207 at that time is set to 300 to 600° C.

In step 2, the valve 243a of the gas supply pipe 232a is closed to stop supply of NH₃. The valve 243d of the gas exhaust pipe 231 is left open, the gas processing chamber 201 is exhausted so as to have a pressure below 20 Pa by the vacuum pump 246, and residual NH₃ is exhausted from the processing chamber 201. At this time, when inert gas such as N₂ is supplied to the processing chamber 201, the effect of exhausting residual NH₃ can be enhanced.

[Step 3]

In step 3, even after the exhaustion of the processing chamber 201 is completed, the valve 243d of the gas exhaust pipe 231 is left open, and the valve 243b provided on the gas supply pipe 232b is opened, thereby supplying the DCS gas, which is supplied from the gas supply pipe 232b and a flow rate of which is adjusted by the mass flow controller 243b, from the gas supply hole 248c of the gas supply unit 249 to the processing chamber 201 while exhausting the DCS gas from the gas exhaust pipe 231. When the DCS gas is allowed to flow, the pressure in the processing chamber 201 is set to 10 to 100 Pa. The supply flow rate of the DCS gas controlled by the mass flow controller 241a is 1,000 to 10,000 sccm. Time during which the wafers 200 are exposed to DCS is 2 to 120 seconds. The temperature of the heater 207 at that time is set to 300 to 600° C. The temperature of the wafers at this time is 300 to 600° C. being the same as the temperature at the time when NH₃ is supplied. The DCS supply causes surface reaction of NH₃ on the base film and DCS form the SiN film on the wafers 200.

After the film is formed, the valve 243b is closed, the valve 243d of the gas supply pipe 231 is left open to exhaust the processing chamber 201 by the vacuum pump 246 so as to be below or equal to 20 Pa, and residual DCS gas after contributing to the film forming is removed. If inert gas such as N₂ is supplied to the processing chamber 201 at this time, the effect of removing the residual DCS gas after contributing to the film forming from the processing chamber 201 is further enhanced.

The above described steps 1 to 3 are set to be one cycle, and the SiN film having a predetermined film thickness is formed on the wafers by repeating this cycle for a plurality of times.

Figure 3:
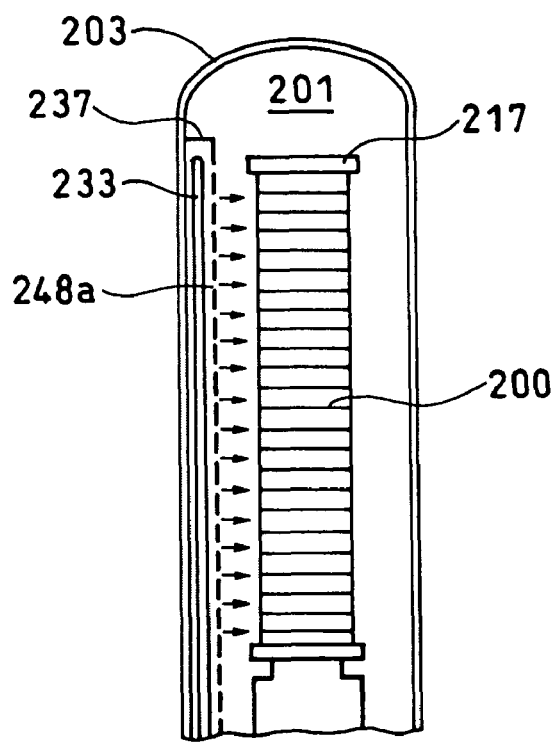
FIG. 3 is a schematic longitudinal sectional view for explaining a loading status of wafers into a boat in the vertical substrate processing furnace of the substrate processing apparatus according to the preferable embodiment of the present invention.
Figure 4:
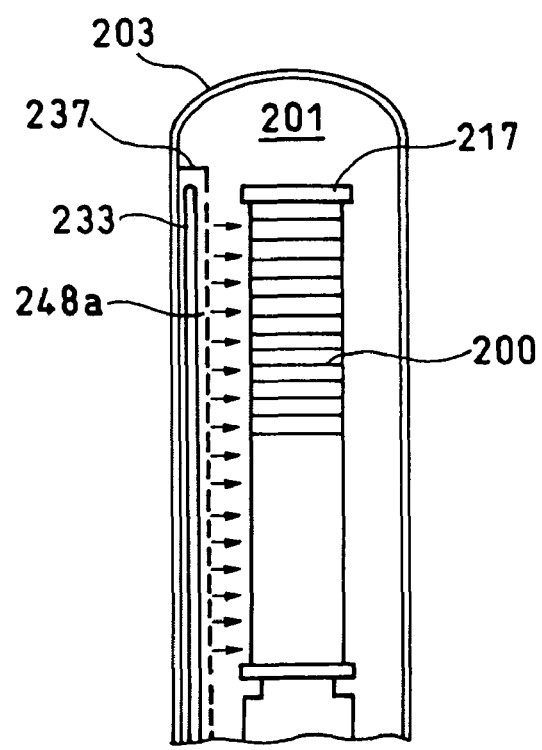
FIG. 4 is a schematic longitudinal sectional view for explaining the loading status of wafers into the boat in the vertical substrate processing furnace of the substrate processing apparatus according to the preferable embodiments of the present invention.
Figure 5:
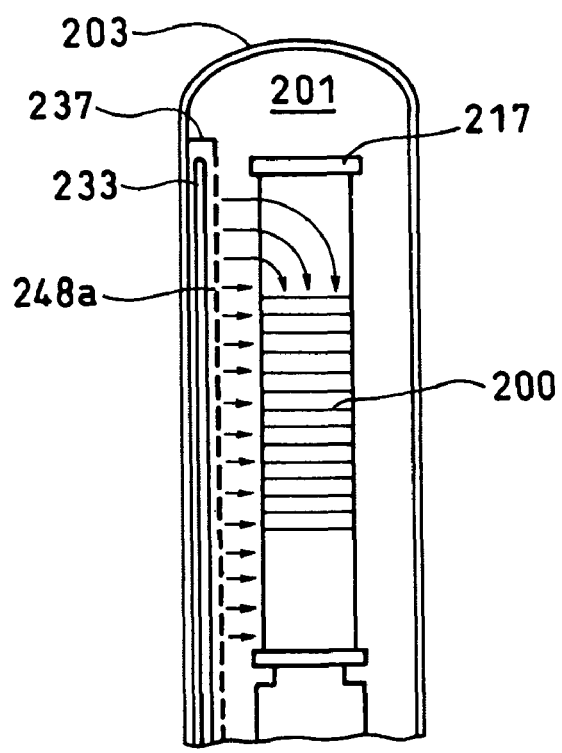
FIG. 5 is a schematic longitudinal sectional view for explaining the loading status of wafers into the boat in the vertical substrate processing furnace of the substrate processing apparatus according to the preferable embodiments of the present invention.
Figure 6:
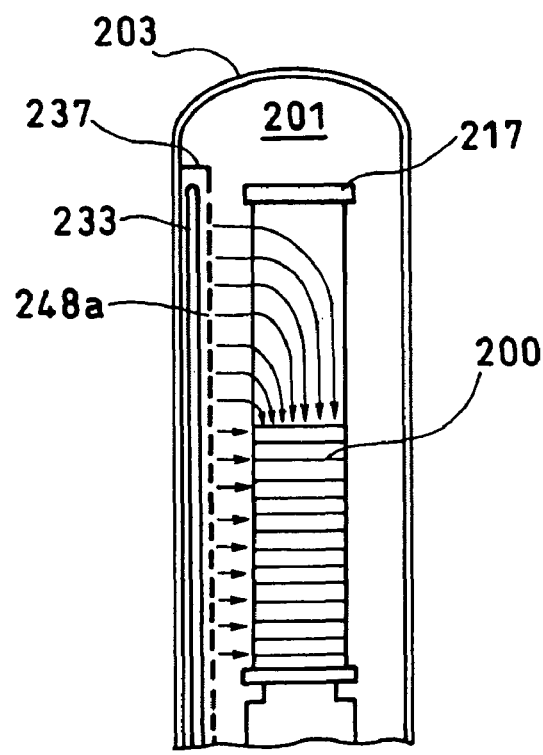
FIG. 6 is a schematic longitudinal sectional view for explaining the loading status of wafers in the boat in the vertical substrate processing furnace of the substrate processing apparatus according to the preferable embodiments of the present invention.

Next, descriptions will be given for the cases where the number of product wafers to be held by the boat 217 is the maximum number of the product wafers which the boat 217 can hold (see FIG. 3) and where the number of product wafers to be held by the boat 217 is less than the maximum number when forming films by using the above described substrate processing apparatus. Regarding the case where the number of wafers 200 for production to be held by the boat 217 is less than the maximum number of product wafers 200 which can be held by the boat 217, FIG. 4 shows when the product wafers 200 are packed in an upper part of the boat 217, FIG. 5 shows when the product wafers 200 are loaded in the center part of the boat 217, and FIG. 6 shows when the product wafers 200 are packed in a lower part of the boat 217. The product wafers 200 comprise the production substrates which actually produces the semiconductor apparatus, at least one side-dummy wafer provided above the production substrate and at least one side-dummy wafer provided below the production substrate.

Concerning the reaction gas supply, the reaction gas is supplied from a lateral direction of the wafers 200 through the gas supply holes 248a formed on the side wall of the buffer chamber 237 from a lower part to an upper part along the stacking direction of the wafers 200 or the gas supply holes 248c (see FIG. 2) formed on the side wall of the gas supply unit 249 from a lower part to an upper part along the stacking direction of the wafers 200. The exhaustion is carried out from the exhausting port formed at a lower part of the reaction tube 203 (See FIG. 1). Therefore, if there is a region in which wafers are not loaded, it is conceived that variation of gas distribution over the entire surfaces of the wafers becomes large because the substantial gas density at the end portions of the wafers increases in a down stream region of the region in which wafers are not loaded and variation of film thickness distribution among the wafers become large. Therefore, in the ALD process, it is desirable that the wafers 200 for production are always placed in the upstream of the gas flow.

Referring to FIGS. 4 to 6, as shown in FIG. 4, density of gas which is received by each wafer when the wafers 200 are packed in the upper part of the boat 217 is the same as the gas density in the case where the maximum number of wafers 200 are loaded in the boat 217. Therefore, uniformity among the wafers 200 when the wafers 200 are packed in the upper part is about the same as the uniformity among the wafers 200 when the maximum number of wafers 200 are loaded.

However, as shown in FIGS. 5 and 6, when the wafers 200 are loaded in the center part of the boat 217 or in the lower part of the boat 217, to the upper side wafers among the loaded wafers, more gas is supplied than in the case where the maximum number of wafers 200 are loaded in the boat 217 from the gas supply holes 248a and the gas supply holes 248c (see FIG. 2) which are at the upper side of the wafers. Therefore, difference in the gas density between the upper side wafers and the wafers in a lower side becomes prominent and the uniformity among the wafers deteriorates.

When the maximum loading number of wafers is 50, the uniformity of the film thickness over entire surfaces of the wafers and among wafers are shown in the table 1 for the cases where 50 wafers 200 are loaded in the boat 217, 25 wafers 200 are packed in the upper part of the boat 217, and 25 wafers 200 are packed in the lower part of the boat 217.

TABLE 1

| Distribution of film thickness | Full Charge 50 wafers | Upper packed 25 wafers | Lower packed 25 wafers |
|---|---|---|---|
| Top wafer surface (%) | 1.2 | 1.6 | 2.6 |
| Bot wafer surface (%) | 1.0 | 1.3 | 1.9 |
| Among wafers (%) | 1.7 | 0.4 | 1.8 |

Concerning the condition for film forming, the temperature for film forming was 550° C., and the following cycle is repeated 10 times. The cycle was as follows: DCS was flowed for 2 seconds with the flow rate of 15 sccm and then, inside the reaction tube 203 is purged for 4 seconds, NH₃ excited by high frequency power of 0.4 kW was flowed for 3 seconds with the flow rate of 4 slm, and the inside of the reaction tube 203 was purged for 4 seconds. The heating condition is the same for the cases where 50 wafers 200 are loaded on the boat 217 and where 25 wafers 200 are loaded on the boat 217, and temperature inclination is not set even for the case where 25 wafers 200 are loaded on the boat 217. The film forming is carried out in an apparatus in which neither the DCS gas tank 247 nor the valve 243c at the downstream side of the gas supply pipe 232b is used.

As shown in Table 1, when 25 wafers 200 are packed in the upper part of the boat 217, the same result is obtained as in the case where 50 wafers 200 are loaded in the boat 217. However, when 25 wafers 200 are packed in the lower part of the boat 217, it shows that the uniformity of the film thickness deteriorates. Here, Top wafer surface indicates over the entire surface of the wafer which is loaded at very top among the loaded wafers, and Bot wafer surface indicates over the entire surface of the wafer which is loaded at very bottom among the loaded wafers.

Figure 7:
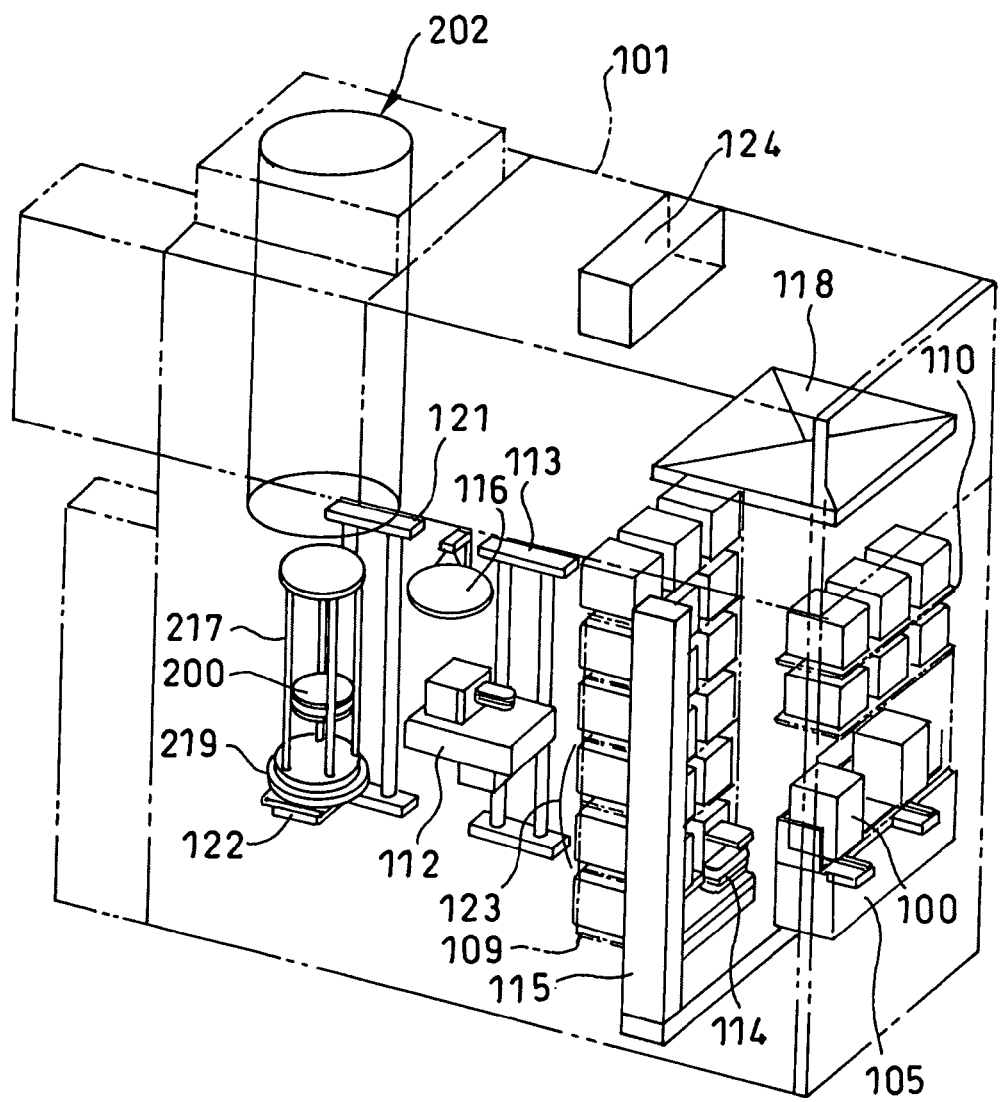
FIG. 7 is a schematic perspective view for explaining the substrate processing apparatus according to the preferable embodiments of the present invention.
Figure 8:
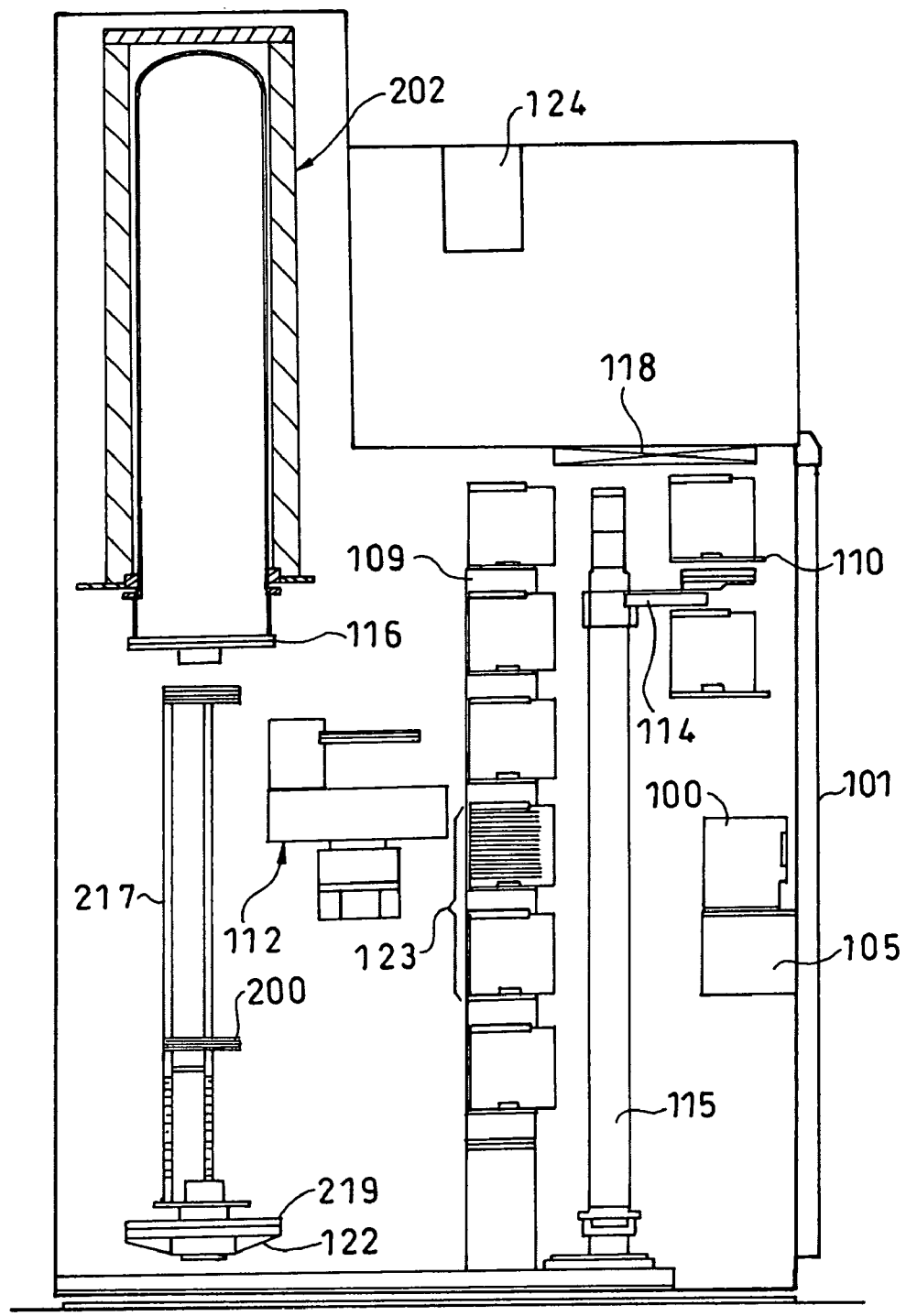
FIG. 8 is a schematic perspective view for explaining the substrate processing apparatus according to the preferable embodiments of the present invention.

Next, an outline of the substrate processing apparatus of the embodiment will be described with reference to FIGS. 7 and 8.

A cassette stage 105 as a holding tool delivery member which deliveries a cassette 100 as a substrate accommodating container between a casing 101 and an external transfer apparatus (not shown) is provided on a front surface side in the casing 101. A cassette elevator 115 as elevator means is provided on a rear side of the cassette stage 105. A cassette loader 114 as transfer means is mounted on the cassette elevator 115. A cassette shelf 109 as placing means of the cassette 100 is provided on the rear side of the cassette elevator 115, and an auxiliary cassette shelf 110 is provided also above the cassette stage 105. A clean unit 118 is provided above the auxiliary cassette shelf 110 so that clean air can flow into the casing 101.

The processing furnace 202 is provided above a rear portion of the casing 101. A boat elevator 121 as elevator means is provided below the processing furnace 202. The boat elevator 121 vertically moves the boat 217 as the substrate holding means to and from the processing furnace 202. The boat 217 holds the wafers 200 as substrates in the multi-stacked manner in their horizontal attitudes. The seal cap 219 as a lid is mounted on a tip end of a vertically moving member 122 which is mounted on the boat elevator 121, and the seal cap 219 vertically supports the boat 217. A loading elevator 113 as elevator means is provided between the boat elevator 121 and the cassette shelf 109. A wafer loader 112 as transfer means is mounted on the loading elevator 113. A furnace opening shutter 116 as shielding means is provided by the side of the boat elevator 121. The furnace opening shutter 116 has an opening/closing mechanism and air-tightly closes a lower side of the processing furnace 202.

The cassette 100 in which the wafers 200 are rotated through 90° by the cassette stage 105 such that wafers 200 are brought into the cassette stage 105 from an external transfer apparatus (not shown) and the wafers 200 assume the horizontal attitudes. The cassette 100 is transferred to the cassette shelf 109 or the auxiliary cassette shelf 110 from the cassette stage 105 by cooperation of vertical movement and lateral movement of the cassette elevator 115 and forward and backward movement and rotational movement of the cassette loader 114.

The cassette shelf 109 includes a transfer shelf 123 in which cassette 100 to be transferred by the wafer loader 112 is accommodated. The cassette 100 on which the wafers 200 are set is transferred to the transfer shelf 123 by the cassette elevator 115 and the cassette loader 114.

If the cassette 100 is transferred to the transfer shelf 123, the wafers 200 are loaded on the boat 217 which is lowered from the transfer shelf 123 by cooperation of forward and backward motion and rotational motion of the wafer loader 112 and vertical motion of the loading elevator 113.

If a necessary number of wafers 200 are loaded on the boat 217, the boat 217 is inserted into the processing furnace 202 by the boat elevator 121, and the processing furnace 202 is air-tightly closed with the seal cap 219. In the air-tightly closed processing furnace 202, the wafers 200 are heated, processing gas is supplied into the processing furnace 202, and the wafers 200 are processed.

If the processing of the wafers 200 is completed, the wafers 200 are moved to the cassette 100 of the transfer shelf 123 from the boat 217 following the above procedure in reverse, the cassette 100 is moved to the cassette stage 105 from the transfer shelf 123 by the cassette loader 114, and is transferred out from the casing 101 by the external transfer apparatus (not shown). In the state in which the boat 217 is lowered, the furnace opening shutter 116 air-tightly closes the lower surface of the processing furnace 202 to prevent outside air from entering into the processing furnace 202.

The transfer motions of the cassette loader 114 and the like are controlled by transfer control means 124.

The entire disclosure of Japanese Patent Application No. 2004-294908 filed on Oct. 7, 2004 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, the uniformity of the film thickness among the substrates can be enhanced without setting new condition even in the case were the number of product substrates to be held by the holding member is less than the maximum number of product substrates which can be held by the holding member.

As a result, the present invention can especially preferably be utilized for a semiconductor wafer processing apparatus and a producing method of a semiconductor device.

What is claimed is:

1. A substrate processing apparatus, comprising:
   a processing chamber;
   a holding member to hold at least a plurality of product substrates in the processing chamber,
   a heating member to heat the substrates,
   a supplying member to alternately supply at least a first reactant and a second reactant into the processing chamber;
   an exhausting port opened to the processing chamber, and
   a control unit, wherein
   the supplying member is composed of an elongated nozzle which includes a large number of gas jet holes, the holding member is to hold a plurality of the substrates so as to be stacked in layers in a longitudinal direction of the nozzle, and the exhausting port is positioned on one end side of the nozzle in the longitudinal direction, and
   the control unit
   executes a processing of forming thin films on the substrates by supplying the first reactant into the processing chamber, removing a surplus of the first reactant after the first reactant has been adsorbed on the product substrates which are held by the holding member, subsequently supplying the second reactant into the processing chamber, to cause the second reactant to react with the first reactant which has been adsorbed on the substrates, and
   allows the product substrates to be packed and held on another end side of the nozzle of the holding member in the longitudinal direction, and executes the processing of forming the thin films on the substrates when the number of the product substrates to be held by the holding member is less than the maximum number of the product substrates which can be held by the holding member.

2. A producing method of a semiconductor device, comprising:
   a first step of allowing a holding member in a processing chamber to hold a plurality of product substrates,
   a second step of heating the substrates, a third step of supplying a first reactant into the processing chamber by a supplying member and allowing the first reactant to be adsorbed on the product substrates, a fourth step of removing a surplus of the first reactant from inside the processing chamber, a fifth step of supplying a second reactant into the processing chamber by a supplying member and allowing the second reactant to react with the first reactant which has been adsorbed on the product substrates to form thin films on the substrates, and a sixth step of repeating at least the steps 3 to 5 for a predetermined times till the thin films having a desired thickness are formed on the product substrates, wherein the supplying member is composed of an elongated nozzle which includes a large number of gas jet holes, the holding member is to hold a plurality of the substrates so as to be stacked in layers in a longitudinal direction of the nozzle, and an exhausting port opened to the processing chamber is positioned on one end side of the nozzle in the longitudinal direction, and the steps 1 to 6 are carried out under conditions that allow the product substrates to be packed and held on another end side of the nozzle of the holding member in the longitudinal direction when a number of the product substrates to be held by the holding member is less than a maximum number of the product substrates which can be held by the holding member.

3. The substrate processing apparatus as recited in claim 1, wherein the control unit executes the processing of forming the thin films under the same condition of the heating member as when the maximum number of product substrates are held by the holding member, when the number of the product substrates to be held by the holding member is less than the maximum number of the product substrates which can be held by the holding member.

\* \* \* \* \*